United States Patent
Jost et al.

(10) Patent No.: US 9,087,954 B2
(45) Date of Patent: Jul. 21, 2015

(54) METHOD FOR PRODUCING THE PENTANARY COMPOUND SEMICONDUCTOR CZTSSE, AND THIN-FILM SOLAR CELL

(75) Inventors: Stefan Jost, Munich (DE); Jorg Palm, Munich (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/002,686

(22) PCT Filed: Feb. 22, 2012

(86) PCT No.: PCT/EP2012/052993
§ 371 (c)(1),
(2), (4) Date: Oct. 21, 2013

(87) PCT Pub. No.: WO2012/119857
PCT Pub. Date: Sep. 13, 2012

(65) Prior Publication Data
US 2014/0053896 A1    Feb. 27, 2014

(30) Foreign Application Priority Data
Mar. 10, 2011  (EP) .................................... 11157718

(51) Int. Cl.
*C30B 1/02*   (2006.01)
*H01L 31/18*  (2006.01)
*H01L 21/02*  (2006.01)
(Continued)

(52) U.S. Cl.
CPC ............ *H01L 31/18* (2013.01); *H01L 21/0256* (2013.01); *H01L 21/02557* (2013.01); *H01L 21/02568* (2013.01); *H01L 21/02614* (2013.01);
(Continued)

(58) Field of Classification Search
CPC ............ C30B 1/02; C30B 1/10; C30B 29/46; C30B 31/02
See application file for complete search history.

(56) References Cited

U.S. PATENT DOCUMENTS

| | | | |
|---|---|---|---|
| 2006/0121701 A1 | 6/2006 | Basol | |
| 2008/0096307 A1 | 4/2008 | Basol | |
| 2009/0148669 A1 | 6/2009 | Basol | |
| 2009/0205714 A1* | 8/2009 | Kuhnlein et al. | ............. 136/264 |

FOREIGN PATENT DOCUMENTS

| | | |
|---|---|---|
| DE | 19956735 | 8/2008 |
| WO | 2011/028957 | 3/2011 |

OTHER PUBLICATIONS

PCT Written Opinion mailed on May 29, 2012 for PCT/EP2012/052993, filed on Feb. 22, 2012 in the name of Saint-Gobain Glass France (English and German).
(Continued)

*Primary Examiner* — Robert M Kunemund
(74) *Attorney, Agent, or Firm* — Steinfl & Bruno LLP

(57) ABSTRACT

A method for producing a compound semiconductor composed of pentanary kesterite/stannite of the type $Cu_2ZnSn(S,Se)_4$ is described. The method has the following steps: producing at least one precursor layer stack consisting of a first precursor layer and a second precursor layer; thermally treating the at least one precursor layer stack in a process chamber; and feeding at least one process gas into the process chamber during the thermal treatment of the at least one precursor layer stack. Furthermore, a thin-film solar cell with an absorber consisting of the pentanary compound semiconductor $Cu_2ZnSn(S,Se)_4$ on a body is described.

12 Claims, 4 Drawing Sheets

(51) Int. Cl.
*H01L 31/065* (2012.01)
*H01L 31/032* (2006.01)

(52) U.S. Cl.
CPC .......... *H01L 31/0326* (2013.01); *H01L 31/065* (2013.01); *Y02E 10/50* (2013.01)

(56) References Cited

OTHER PUBLICATIONS

K. Wang et al., "Thermally evaporated $Cu_2ZnSnS_4$ solar cells", Applied Physics Letters, 97, 143508 (2010), 4 pages.

B. A. Schubert et al., "$Cu_2ZnSnS_4$ thin film solar cells by fast coevaporation", Progress in Photovoltaics: Research and Applications, vol. 19, Issue 1, pp. 93-96, Jan. 2011 (First published online May 2010, DOI: 10.10002/pip.976).

Friedelmeier et al., Conf. Proc. Eupvsec $14^{th}$, (1997), pp. 1242-1245.

Volobujeva et al., "SEM analysis and selenization of Cu-Zn-Sn sequential films produced by evaporation of metals", Optoelectronic and Microelectronic Materials and Devices 2008, COMMAD 2008, Conference on Jul. 28-Aug. 1, 2008 in Sydney, SA, pp. 257-260.

H. Katagiri et al., "Development of CZTS-based thin film solar cells", Thin Solid Films, Elsevier-Sequoia S.A. 25 Lausanne, CH, vol. 517, No. 7, Feb. 2, 2009, pp. 2455-2460.

\* cited by examiner

METHOD FOR PRODUCING THE PENTANARY COMPOUND SEMICONDUCTOR CZTSSE, AND THIN-FILM SOLAR CELL

CROSS REFERENCE TO RELATED APPLICATIONS

The present application is the US national stage of International Patent Application PCT/EP2012/052993 filed on Feb. 22, 2012 which, in turn, claims priority to European Patent Application EP 11157718.5 filed on Mar. 10, 2011.

The invention is in the technical area of the production of thin-film solar cells and relates to a method for producing a compound semiconductor consisting of pentanary kesterite/stannite of the type $Cu_2ZnSn(S,Se)_4$, as well as a thin-film solar cell with an absorber made of pentanary kesterite/stannite of the type $Cu_2ZnSn(S,Se)_4$ with a defined sulfur depth profile.

Recently, solar cells are increasingly being used for photovoltaic conversion of sunlight into electrical energy. With respect to efficiency, thin-film solar cells based on polycrystalline chalcopyrite semiconductors of the group $Cu(In,Ga)(S,Se)_2$ have proved to be advantageous, with, in particular, copper indium diselenide ($CuInSe_2$) distinguished by a particularly high absorption coefficient because of its band gap suited to the spectrum of sunlight.

Due to high material costs of indium and gallium and in light of long-term material availability, more recently, there is an increased search for alternatives to the compound semiconductors based on $Cu(In,Ga)(S,Se)_2$. Semiconductor layers of the kesterite/stannite type, consisting of pentanary $Cu_2ZnSn(S,Se)_4$ (generally abbreviated as "CZTSSe"), of quaternary $Cu_2ZnSnSe_4$ (generally abbreviated as "CZTSe"), or of quaternary $Cu_2ZnSnS_4$ (generally abbreviated as "CZTS") are a very promising development. These semiconductor layers have, with visible light, a high absorption coefficient on the order of $10^4$ cm$^{-1}$ and a direct band gap on the order of 1.5 eV.

Various methods for their production are described in the literature, using, in particular, the co-deposition of the semiconductor components onto a substrate (cf. IBM, K. Wang et al., APL 97, 143508 (2010); HZB, B. A. Schubert et al., Progr. In Photov.: Res. and Appl. (2010) 10.10002/p. 976; ZSW 1997, Friedelmeier et al. Conf. Proc. EUPVSEC 14th (1997) 1242-1245).

In Volobujeva et al.: "SEM analysis and seleniumization of Cu—Zn—Sn sequential films produced by evaporation of metals", Optoelectronic and Microelectronic Materials and Devices 2008, Commad 2008, Conference on, IEEE, Piscataway, N.J., USA, Jul. 28, 2008, pages 257-260, XP031437704, a method for producing the quaternary CZTSe-compound semiconductor is described. In the method presented there, a layer stack of the elements Cu, Zn, and Sn is first deposited by vacuum deposition onto a molybdenum substrate. Then, the layer stack is converted by thermal treatment in an atmosphere with elemental Se into the compound semiconductor.

In Katagiri et al.: "Development of CZTS-based thin film solar cells", Thin Solid Films, Elsevier-Sequoia S.A. Lausanne, CH, Vol. 517, No. 7, Feb. 2, 2009, pages 2455-2460, XP025928657, a method for producing the quaternary CZTS-compound semiconductor is described. In the method presented there, the elements Cu, Zn, and Sn are deposited by co-sputtering and, then, converted by thermal treatment in a S-containing atmosphere into the compound semiconductor.

In contrast, the object of the present invention consists in advantageously improving methods known in the prior art for producing a compound semiconductor composed of pentanary kesterite/stannite of the type $Cu_2ZnSn(S,Se)_4$ or CZTSSe and corresponding compound semiconductors. This and other objects are accomplished according to the proposal of the invention by a method for producing a compound semiconductor, as well as a thin-film solar cell with the characteristics of the coordinated claims. Advantageous embodiments of the invention are indicated by the characteristics of the subclaims.

According to the invention, a method for producing a compound semiconductor composed of pentanary kesterite/stannite of the type $Cu_2ZnSn(S,Se)_4$ is presented, which is preferably part of a method for production of a thin-film solar cell or a thin-film solar module. The compound semiconductor contains the metals copper (Cu), zinc (Zn), and tin (Sn) as well as the chalcogens sulfur (S) and selenium (Se). The term "thin-film solar cell" refers here and in the following to photovoltaic layer systems with thicknesses of only a few microns. Such layer systems require carrier substrates to provide adequate mechanical stability. Known carrier substrates for thin-film solar cells include inorganic glass, polymers, or metal alloys and can be designed, as a function of layer thickness and material properties, as rigid plates or flexible films.

The method according to the invention comprises the following steps:

A step for producing at least one precursor layer stack, consisting of a first precursor layer and a second precursor layer, in two stages, wherein, in a first stage, the first precursor layer is produced by deposition of the metals copper (Cu), zinc (Zn), and tin (Sn) onto a body and, in a second stage, the second precursor layer is produced by deposition of at least one chalcogen, selected from sulfur (S) and selenium (Se), onto the first precursor layer. Thus, in the second stage, the second precursor layer is produced by deposition of sulfur or alternatively by deposition of selenium or alternatively by deposition of sulfur and selenium in combination.

Another step for the thermal treatment of the at least one precursor layer stack in a process chamber during a first time interval such that the metals of the first precursor layer and the at least one chalcogen of the second precursor layer are reactively converted into the pentanary compound semiconductor $Cu_2ZnSn(S,Se)_4$. The notation "$Cu_2ZnSn(S,Se)_4$" means that the chalcogens sulfur (S) and selenium (Se) are included in combination in the compound semiconductor.

The thermal treatment of the at least one precursor layer stack takes place in a process gas atmosphere, which contains at least at times at least one chalcogen, i.e., sulfur (S) and/or selenium (Se), and/or at least one chalcogen-containing compound in which sulfur and/or selenium is included in bonded form. For this, one or a plurality of process gases, containing at least one elemental chalcogen, selected from sulfur and selenium, and/or at least one chalcogen-containing compound in which sulfur and/or selenium is included in bonded form, for example, hydrogen sulfide ($H_2S$) or hydrogen selenide ($H_2Se$) or other sulfur or selenium-containing gases, are fed into the process chamber at least at times during the thermal treatment of the at least one precursor layer stack.

It is essential here that if a chalcogen, selected from sulfur and selenium (sulfur or, alternatively, selenium) is contained in the second precursor layer, the respective other chalcogen and/or a compound containing the respective other chalcogen is contained in the process gas, or, alternatively, if the two chalcogens sulfur and selenium are contained in combination in the second precursor layer, sulfur and/or selenium and/or a sulfur containing compound and/or a selenium-containing compound is contained in the process gas.

The invention presents a novel method for producing the pentanary compound semiconductor $Cu_2ZnSn(S,Se)_4$, wherein in a (two-stage) first step, the metals copper, zinc, and tin and, subsequently, the chalcogens sulfur and/or selenium are deposited. After the deposition of the precursor elements, the thermal processing takes place in a second step in a chalcogen-containing environment for the conversion of the precursor layers into the pentanary compound semiconductor.

In the method according to the invention, for the first time, a definable or defined sulfur depth profile (based on the combined content of selenium and sulfur) can be implemented in a predefinable manner in the pentanary compound semiconductor $Cu_2ZnSn(Se,S)_4$, by means of the chalcogen in the process gas. For example, selenium contained in the second precursor layer is replaced by sulfur in the process gas such that the sulfur content decreases with increasing depth and, complementarily, the selenium content increases. Likewise, sulfur contained in the second precursor layer can be replaced by selenium in the process gas in the compound such that the sulfur content increases with increasing depth and, complementarily, the selenium content decreases. It is thus not introduced into the converted compound semiconductor, i.e., the composition of the compound semiconductor is not influenced, by the chalcogen (sulfur or selenium) in the process gas, but rather, in addition, through the substitution of the respective other chalcogen (selenium or sulfur), which is contained in the second precursor layer, the sulfur depth profile, based on the total content of sulfur and selenium, can be selectively adjusted. Through the chalcogen in the process gas, the sulfur content (based on the combined content of selenium and sulfur in the compound content (S/Se+S)) can thus be adjusted. In this manner, a compound semiconductor with a defined band gap profile can be produced.

Without being tied to a particular theory, an increase in the efficiency of a thin-film solar cell is anticipated as a result of this. For example, a sulfur depth profile with a maximum value of the ratio S/(Se+S) on the absorber surface and a decreasing value of the ratio S/(Se+S) in the absorber interior can be set. The resultant increased band gap on the absorber surface leads in the thin-film solar cell to an increase in the open circuit voltage. On the other hand, the level of the short-circuit current is determined by the minimum of the band gap in the absorber interior. In combination, the defined sulfur depth profile leads to an increase in the efficiency of the thin-film solar cell.

In addition to the adjustment of a band gap-depth profile, the possibility exists to increase the efficiency of the thin-film solar cell through an improvement of the crystal quality of the semiconductor layer. For example, it is known from analyses of the material system Cu—In—Ga—Se—S that the various metals have different reaction kinetics with different chalcogens. This results in clear differences in the formation temperature of the various metal-chalcogenide phases and can thus negatively affect the crystal quality of the $Cu(In,Ga)(S,Se)_2$ semiconductor. Without being tied to a theory, similar correlations are also conceivable for the material system Cu—Zn—Sn. It can, in particular, be assumed that a changed chalcogen gas atmosphere (Se/S composition) in the heating process can have an influence on the chalcogenization of the Cu—Zn—Sn precursor. Thus, differences in the chalcogenization kinetics can be compensated by a temporarily altered process gas atmosphere (Se/S composition). It is anticipated that crystal quality and efficiency can be positively influenced by this.

This enables the production of compound semiconductors with high crystal quality or thin-film solar cells with good efficiency.

It is noted merely for the sake of completeness that it is, in particular, also possible to produce compound semiconductors with a homogeneous composition in terms of the sulfur content, in which the sulfur content is unchanged over the layer thickness.

As already mentioned, the sulfur depth profile in the pentanary compound semiconductor can be selectively adjusted with regard to the band gap and the crystal quality. In particular, the sulfur depth profile from a surface of the compound semiconductor toward a body interface can be implemented such that the sulfur content has a maximum value on the semiconductor surface, decreases toward the body interface, and has a minimum value on the body interface; or the sulfur content has a minimum value on the semiconductor surface, increases toward the body interface, and has a maximum value on the body interface; or the sulfur content has a first maximum value on the semiconductor surface, decreases toward the body interface to a minimum value, and, then, increases again, and has a second maximum value on the body interface; or the sulfur content has a first minimum value on the semiconductor surface, increases toward the body interface to a maximum value, and, then, decreases again, and has a second minimum value on the body interface.

Preferably, the sulfur depth profile is implemented such that a relative variation of the sulfur content, at least over a part of the depth profile, i.e., over at least a part of the layer thickness of the compound semiconductor, in particular from the semiconductor surface to the body interface, is at least 10%, at least 20%, at least 30%, at least 40%, at least 50%, at least 60%, at least 70%, or at least 80%. Particularly preferably, the relative variation in the sulfur content is at least 20%.

In the method according to the invention, the at least one process gas can be fed into the process chamber continuously during a first time interval of the thermal treatment or, however, only during one or a plurality of second time intervals, which are, in each case, shorter than the first time interval. For example, the at least one process gas can be fed in an earlier and/or a later phase of the thermal treatment into the process chamber. In particular, it is possible in the method according to the invention that the at least one process gas is fed in such that the composition of the chalcogen-containing atmosphere in the process chamber varies during the thermal treatment in order to thus selectively influence the composition of the compound semiconductor produced.

Advantageously, at the time of deposition of the second precursor layer, the body has a temperature of less than 100° C., by means of which an unintentional (partial) reaction already at the time of deposition of the precursor materials can be reliably prevented. Both during the deposition of the metals copper, zinc, and tin and during the deposition of the at least one chalcogen, one or a plurality of dopants (e.g., sodium) can be deposited.

In order to influence the crystal quality of the compound semiconductor produced and, in particular, the efficiency of the thin-film solar cell, it can be advantageous, for deposition of the first precursor layer, to deposit a layer stack consisting of individual layers of the metals copper, zinc, and tin (with each individual layer consisting of a single metal) several times consecutively. For this purpose, it can be further advantageous, for deposition of the second precursor layer, to deposit a layer stack consisting of individual layers of the chalcogens sulfur and selenium (with each individual layer consisting of a single chalcogen) several times consecutively. Likewise, it can be advantageous with regard to the crystal quality for the precursor layer stack to be deposited several times consecutively.

In the method according to the invention, the first precursor layer can, in principle, be implemented such that the copper content is less than the combined content of zinc and tin, or the copper content is equal to the combined content of zinc and tin, or the copper content is greater than the combined content of zinc and tin.

On the other hand, the first precursor layer can, in principle, be implemented such that the zinc content is less than the tin content, or the zinc content is equal to the tin content, or the zinc content is greater than the tin content.

Particularly advantageously, the first precursor layer is implemented such that the copper content is less than the combined content of zinc and tin, and, at the same time, the zinc content is greater than the tin content, with the assumption that by means of this measure, a beneficial influence on the crystal quality and the efficiency of the thin-film solar cell can be achieved.

In another advantageous embodiment of the method according to the invention, for production of the pentanary compound semiconductor CZTSSe, the two precursor layers are implemented such that the ratio of the total content of chalcogens to the total content of metals is greater than or equal to 1. By means of this measure as well, a beneficial influence on the crystal quality and the efficiency of the thin-film solar cell can be achieved.

The invention further extends to a thin-film solar cell with an absorber implemented as a compound semiconductor consisting of pentanary kesterite/stannite of the type $Cu_2ZnSn(S, Se)_4$ on a body, wherein the absorber has, from a semiconductor surface to a body interface a definable or defined sulfur depth profile (based on a combined content of selenium and sulfur). Here, the sulfur depth profile is implemented such that the sulfur content has a maximum value on the semiconductor surface, decreases toward the body interface, and has a minimum value on the body interface; or the sulfur content has a minimum value on the semiconductor surface, increases toward the body interface, and has a maximum value on the body interface; or the sulfur content has a first maximum value on the semiconductor surface, decreases to a minimum value toward the interface, and, then, increases again, and has a second maximum value on the body interface; or the sulfur content has a first minimum value on the semiconductor surface, increases to a maximum value toward the body interface, and, then, decreases again, and has a second minimum value on the body interface.

Preferably, the sulfur depth profile is implemented such that a relative variation of the sulfur content at least over a part of the depth profile, i.e., over at least one one part of the layer thickness of the compound semiconductor, in particular from the semiconductor surface to the body interface is at least 10%, at least 20%, at least 30%, at least 40%, at least 50%, at least 60%, at least 70%, or at least 80%. Particularly preferably, the relative variation in the sulfur content is at least 20%.

The invention further extends to the use of the above-described method for producing a compound semiconductor composed of pentanary kesterite/stannite of the type $Cu_2ZnSn(S,Se)_4$ for producing the semiconductor layer (absorber) of a thin-film solar cell or of a thin-film solar module.

It is understood that the various embodiments of the invention can be realized individually or in any combinations. In particular, the characteristics mentioned above and those to be explained in the following can be used not only in the combinations indicated, but also in other combinations or alone without departing from the scope of the present invention.

BRIEF DESCRIPTION OF THE DRAWINGS

The invention is now explained in detail using exemplary embodiments, referring to the accompanying figures. They depict, in simplified, not-to-scale representation.

DETAILED DESCRIPTION OF THE DRAWINGS

Figure 1:
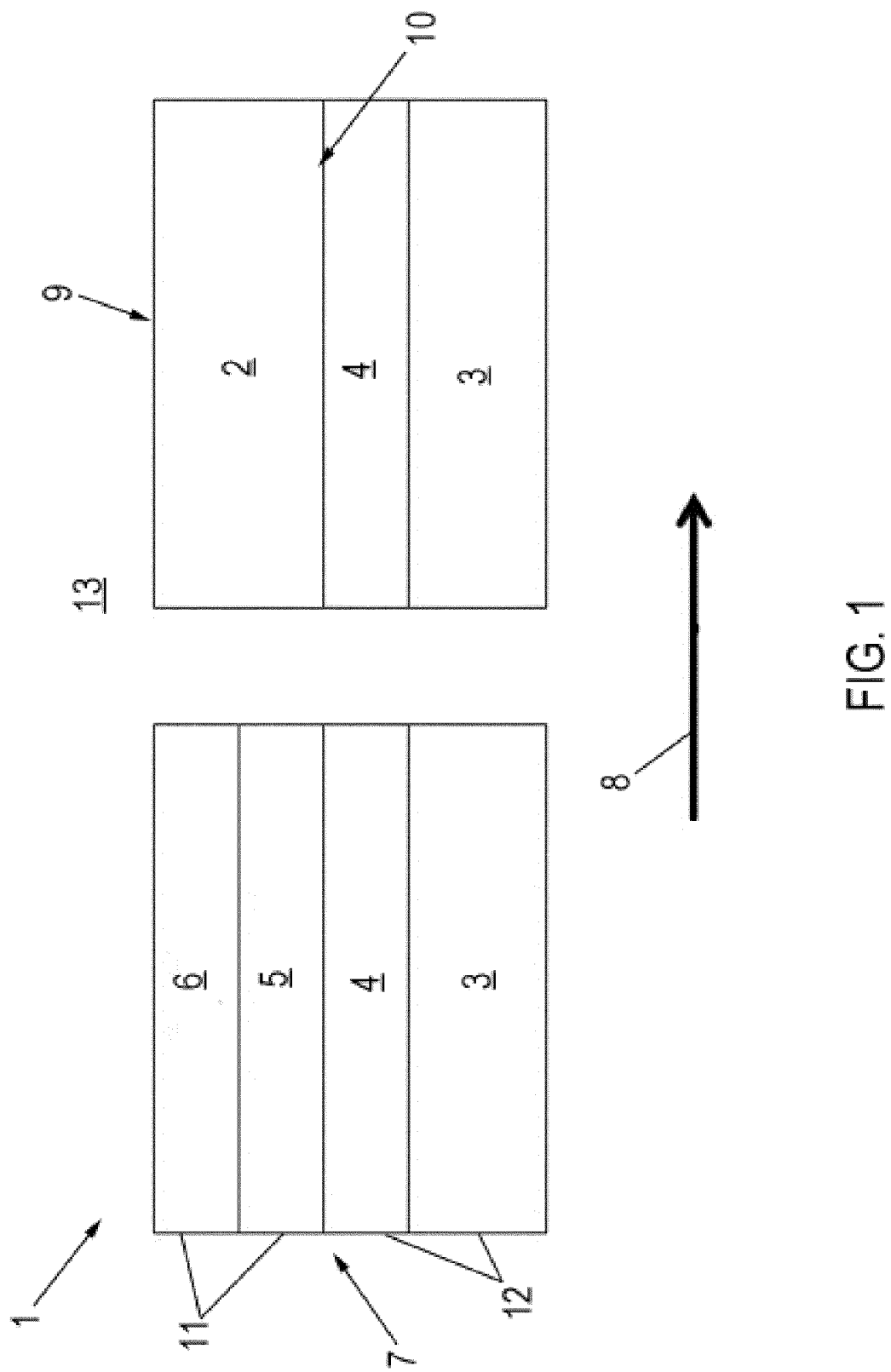
FIG. 1 sectional views to illustrate the general method for producing an absorber of a thin-film solar cell consisting of the compound semiconductor CZTSSe.

Reference is first made to FIG. 1, in which, using schematic sectional views, a general method for producing a light-absorbing compound semiconductor layer or absorber 2 in a layer structure of a thin-film solar cell or thin-film solar module, referred to as a whole by the reference character 1, is illustrated. It is understood that the layer structure 1 can serve for producing a large number of thin-film solar cells, which are connected to each other in series in a monolithically integrated manner in a large-area arrangement.

Here, the layer structure 1 has a substrate configuration, in which a layer construction 7 consisting of a plurality of thin layers is applied on a (carrier) substrate 3. In this case, the substrate 3 is made, for example, of inorganic glass, with it equally possible to use other insulating materials with sufficient stability as well as inert behavior relative to the process steps performed during production of the thin-film solar cell, for example, plastics, in particular polymers or metals, in particular metal alloys. Depending on the layer thickness and the specific material properties, the substrate 3 can be designed as a rigid plate or flexible film. In the present exemplary embodiment, the layer thickness of the substrate is, for example, 1 to 5 mm.

The layer construction 7 applied on the substrate 3 comprises a back electrode layer 4, which is disposed on a light-entry side surface of the substrate 3 and is made, for example, from an opaque metal. It can, for example, be deposited on the substrate 3 by vapor deposition or magnetic field-assisted cathode sputtering. The back electrode layer 4 is made, for example, from molybdenum (Mo), aluminum (Al), copper (Cu), titanium (Ti), or from a multilayer system with such a metal, for example, molybdenum (Mo). The layer thickness of the back electrode layer 4 is, in this case, less than 1 µm, preferably in the range from 300 nm to 600 nm and is, for example, approx. 500 nm. The back electrode layer 4 serves as a back contact or back electrode of the thin-film solar cell. An alkali barrier, made, for example, of $Si_3N_4$, SiON, or SiCN, can be disposed between the substrate 3 and the back electrode layer 4. This is not shown in detail in FIG. 1.

A first precursor layer 5 and a second precursor layer 6 are disposed one after the other on the back electrode layer 4. The two precursor layers 5, 6 can be reactively converted by a thermal treatment indicated by arrow 8 into the photovoltaic layer active absorber 2. The layer thickness of the absorber 2 is, for example, in the range from 1 to 5 µm and is, in particular, approx. 2 µm.

The layer structure 1 depicted in FIG. 1 represents an intermediate product in the production of the thin-film solar cell. The further processing of the layer structure 1 is unnecessary for the understanding of the invention such that it need not be discussed further here. Merely for the sake of completeness, it is noted that a front electrode layer that serves as a front-side contact or front electrode and is transparent to radiation in the visible spectral range ("window layer") is implemented above the absorber 2. Usually, a doped metal oxide, (TCO=transparent conductive oxide), for example, n-conductive, aluminum (Al)-doped zinc oxide (ZnO), boron (B)-doped zinc oxide (ZnO), or gallium (Ga)-doped zinc oxide (ZnO), is used for the front electrode layer. A thin buffer layer, made, for example, of CdS, $In_xS_y$, $(In,Ga,Al)_x(S,Se)_y$, ZnS, Zn(O,S), Zn(Mg,O), optionally in combination with intrinsic i-ZnO, is usually disposed between the absorber 2 and the front electrode layer. By means of the buffer layer, improved adaptation of the front electrode layer to the absorber 2 with regard to lattice constant and band tracking can be achieved.

Together, the front electrode layer, buffer layer, absorber layer, and back electrode layer form a heterojunction, i.e., a sequence of layers of the opposing conductor type. The layer thickness of the front electrode layer is, for example, approx. 300 to 1500 nm; that of the buffer layer is, for example, approx. 50 nm.

For protection against environmental influences, a plastic layer (encapsulation film) made, for example, of polyvinyl butyral (PVB), ethylene vinyl acetate (EVA), or DNP can be applied to the front electrode layer. In addition, a cover plate transparent to sunlight that is made, for example, from extra white glass (front glass) with a low iron content and can have a thickness of, for example, 1 to 4 mm, can be provided.

The described construction of a thin-film solar cell or a thin-film solar module is well known to the person skilled in the art, for example, from commercially available thin-film solar cells or thin-film solar modules and has also already been described in detail in numerous printed documents in the patent literature (e.g., DE 19956735 B4).

In the substrate configuration depicted in FIG. 1, the back electrode layer 4 adjoins the substrate 3. It is understood that the layer structure 1 can also have a superstrate configuration, in which the substrate is transparent and the front electrode layer is disposed on a surface of the substrate 3 facing away from the light-entry side.

As already mentioned, the layer structure 1 can serve for production of integrated serially connected thin-film solar cells, with the layer structure 1 structured in a manner known per se by various structuring lines ("P1" for back electrode, "P2" for front electrode/back electrode contact and "P3" for separation of the front electrode). Alternatively, a construction of the thin-film solar cell with a front electrode and grid can be provided.

The method illustrated in FIG. 1 serves for producing a light-absorbing thin-film semiconductor layer or absorber 2 of the kesterite- or stannite-type, wherein the absorber 2 is made of CZTSSe.

The first precursor layer 5 is made of the metals Cu, Zn, and Sn and is deposited from purely mental sources onto the back electrode layer 4 or a (multilayer) body 12, consisting of substrate 3 and back electrode layer 4 (as well as, optionally, additional layers). Deposition of the metals Cu, Zn, Sn onto the body 12 can be realized, in particular, by the processes mentioned in the following, with the optional possibility of feeding in one or a plurality of dopants (e.g., Na). These are typically vacuum coating methods, in which a solid or liquid material is transformed into the gas phase by inputting energy and condensed on the body 12 (PVD=physical vapor deposition):

Sputtering of the elements Cu, Zn, Sn from targets in which these metals are contained in elemental form (element targets). Preferably, the element targets have, in each case, a purity of ≥4N, even more preferably ≥5N.

Sputtering of the elements Cu, Zn, Sn from targets, in which binary and/or ternary alloys of these metals are contained (alloy targets), for example, Cu—Sn, Cu—Zn, Zn—Sn, or Cu—Zn—Sn and/or combinations thereof. Preferably, the alloy targets have, in each case, a purity of ≥4N, even more preferably ≥5N. Optionally, it is possible additionally to sputter from element targets of the elements Cu, Zn, Sn, in order to adjust the composition (stoichiometry) of the first precursor layer 5 as desired.

Thermal evaporation, electron beam evaporation, or laser material ablation of the elements Cu, Zn, Sn from sources in which these metals are contained in elemental form (element sources). Preferably, the element sources have, in each case, purity of ≥4N, even more preferably ≥5N.

Thermal evaporation, electron beam evaporation, or laser material ablation of the elements Cu, Zn, Sn from sources in which binary and/or ternary alloys of these metals are contained (alloy sources), for example, Cu—Sn, Cu—Zn, Zn—Sn, or Cu—Zn—Sn and/or combinations thereof. Preferably, the alloy sources have, in each case, purity of ≥4N, even more preferably ≥5N. Optionally, it is possible additionally to deposit from element sources of the elements Cu, Zn, Sn, in order to adjust the composition (stoichiometry) of the first precursor layer 5 as desired.

In the case of deposition of the metals Cu, Zn, Sn using element targets or element sources, the first precursor layer 5 includes multiple metal individual layers, with each individual layer consisting of Cu, Zn, or Sn. For example, the individual layers can be deposited in the layer sequence Cu/Zn/Sn, but with other layer sequences also possible. In a preferred embodiment, a layer sequence consisting of individual layers of the metals Cu, Zn, Sn, for example, Cu/Zn/Sn, deposited several times consecutively such that the first precursor layer 5 consists of a stack of n same or different layer sequences (e.g., n×Cu/Zn/Sn). Preferably, 2 to 20 layer sequences are deposited consecutively (n=2 to 20).

In the case of the deposition of the metals Cu, Zn, Sn using alloy targets or alloy sources, the first precursor layer 5 includes one or a plurality of metallic individual layers that are made of a binary or ternary alloy of the elements Cu, Zn, and/or Sn. If, in addition, deposition is carried out from element targets or element sources, the individual layers can also contain elemental Cu, Zn, and/or Sn. The metallic individual layers can be deposited in a defined layer sequence. In a preferred embodiment, a layer sequence, consisting of individual layers of binary or ternary alloys of the metals Cu, Zn, and/or Sn (as well as, optionally, elemental Cu, Zn, and/or Sn) can be deposited several times consecutively such that the first precursor layer 5 consists of a stack of n same or different layer sequences. Preferably, 2 to 20 layer sequences are deposited consecutively (n=2 to 20).

In the layer structure 1, the first precursor layer 5 can be implemented such that its composition is copper poor, which means that the copper content is less than the combined content of Zn and Sn (Cu/(Zn+Sn)<1), or alternatively is stoichiometric, which means that the copper content is equal to the combined content of Zn and Sn (Cu/(Zn+Sn)=1), or alternatively is copper rich, which means that the copper content is greater than the combined content of Zn and Sn (Cu/(Zn+Sn)>1).

All three variants with regard to the copper content can be provided in the method according to the invention.

Furthermore, the first precursor layer 5 can be implemented in the layer structure 1 such that its composition is zinc poor, which means that the zinc content is less than the tin content (Zn/Sn<1), or alternatively is stoichiometric, which means that the zinc content is equal to the tin content (Zn/Sn=1), or alternatively is zinc rich, which means that the zinc content is greater than the tin content (Zn/Sn>1).

All three variants with regard to the zinc content can be provided in the method according to the invention. Each variant with regard to the copper content can be combined with each variant with regard to the zinc content. In terms of particularly good efficiency of the thin-film solar cell, it is preferable, according to the invention, for the first precursor layer 5 to be implemented such that its composition is copper poor (Cu/(Zn+Sn)<1) and, at the same time, zinc rich (Zn/Sn>1). For example, for this, the absorber 2 can have a copper content of 0.8 (Cu/(Zn+Sn)=0.8) based on the combined content of zinc and tin and a zinc content of 1.22 (Zn/Sn=1.22) based on the tin content.

Next, the second precursor layer 6 is deposited onto the first precursor layer 5. The second precursor layer 6 consists of at least one chalcogen, i.e., S and/or Se. The at least one chalcogen is deposited without metallic components or binary metal-chalcogen compounds. Preferably, the temperature of the substrate 3 during deposition of the at least one chalcogen is lower than 150° C., particularly preferably lower than 100° C., by means of which, advantageously, an already beginning partial reaction of the metals of the first precursor layer 5 with the at least one chalcogen of the second precursor layer 6 can be prevented.

The deposition of S and/or Se can be realized, for example, by the methods mentioned in the following, with the possibility, with all the methods, of optionally feeding in one or a plurality of dopants (e.g., Na):

Thermal evaporation (PVD [physical vapor deposition]) of S and/or Se (sequentially or simultaneously) from one or two evaporation sources, optionally, with the addition of dopant (e.g., Na) by evaporation of the dopant or of a dopant-containing compound.

Sputtering from targets, in which the respective chalcogen (S or Se) is contained in elemental form (element targets).

Together, the two precursor layers 5, 6 form a precursor layer stack 11. According to the invention, it can be advantageous for the precursor layer stack 11 to be deposited several times consecutively (multi-sequence). This measure can be advantageous, in particular for crystal formation and/or adjusting a desired sulfur depth profile (based on the total chalcogen quantity) of the pentanary compound semiconductor CZTSSe. According to one embodiment of the method according to the invention, it can be preferable with the pentanary absorber 2 for the two precursor layers 5, 6 to have a composition such that the ratio chalcogens/metals is greater than or equal to 1.

As indicated schematically by the arrow in FIG. 1, the two precursor layers 5, 6 are subjected to a form of rapid thermal treatment (generally known as "rapid thermal processing" (RTP)), which effects a reactive conversion of the metals Cu, Zn, Sn, and S and/or Se into the pentanary compound semiconductor CZTSSe. Thermal treatment of the two precursor layers 5, 6 is carried out at least at times in a chalcogen-containing atmosphere inside a process chamber 13 containing the layer structure 1, wherein, depending on the compound semiconductor to be produced, one or a plurality of process gases (sulfur and/or selenium and/or hydrogen sulfide ($H_2S$) and/or hydrogen selenide ($H_2Se$) or combinations thereof) are fed into the process chamber 13 in a controlled manner. Each process gas is fed in during at least one (predefined) time interval during the thermal treatment, with the time interval shorter than the time of the entire thermal treatment or corresponding to the time of the entire thermal treatment. The amount of each process gas fed in per unit of time can be unchanged during the addition or can vary. In particular, the composition of the chalcogen-containing atmosphere during the thermal treatment can be unchanged or can vary.

Thermal treatment requires:

rapid heating rates in the range of a few K/sec, maximum temperatures above 400° C., preferably above 500° C., high temperature homogeneity over the substrate area (lateral) and its layer thickness, ensuring an adequately high controllable and reproducible partial pressure of the at least one chalcogen (Se and/or S) during the thermal processing (prevention of Se- and/or S-losses), controlled process gas feed, e.g., $H_2$, $N_2$, Ar, S-gas, Se-gas, $H_2S$, $H_2Se$, and combinations thereof, with suitable gas temperature-time profiles.

Thermal treatment of the two precursor layers 5, 6 can, for example, take place using a process box accommodating the layer structure 1 in a tunnel or inside a process hood surrounding the layer structure 1. For performance of the thermal treatment, one or a plurality of layer structures 1 with parallel substrates 3 can be arranged next to each other or one above another (dual substrate or multilevel process).

For production of the pentanary compound semiconductor CZTSSe, the thermal processing of the two precursor layers 5, 6 is preferably carried out using a controlled temperature-process gas profile such that the ratio S/(Se+S), i.e., the sulfur content based on the combined contents of S and Se, in the absorber 2 has a defined depth profile.

The term "(sulfur-) depth profile" refers to the sulfur content or curve of the value of the quotient S/(Se+S) in the absorber 2 along a linear dimension of the absorber 2, starting from an (absorber) surface 9 facing away from the substrate 3 to an interface 10 facing the substrate 3 in a direction perpendicular to the stack sequence of the layer construction 7 or in the direction of the layer thickness.

According to a first variant, the thermal treatment (RTP processing) is carried out such that the depth profile has a declining curve over the layer thickness, i.e., the value of the ratio S/(Se+S) is at its maximum on the surface 9 and decreases from the surface 9 toward the interface 10 such that the value of the ratio S/(Se+S) is at its minimum on the interface 10.

According to a second variant, the thermal treatment (RTP processing) is carried out such that the depth profile has a rising curve over the layer thickness, i.e., the value of the ratio S/(Se+S) is at its minimum on the surface 9 and increases from the surface 9 toward the interface 10 such that the value of the ratio S/(Se+S) is at its maximum on the interface 10.

According to a third variant, the thermal treatment (RTP processing) is carried out such that the depth profile over the layer thickness first has a declining curve and then a rising curve, i.e., the value of the ratio S/(Se+S) has a first maximum value on the surface 9, initially decreases from the surface 9 toward the interface 10, and assumes a (single) minimum value between the surface and the interface 9, 10, and, then, increases again such that the value of the ratio S/(Se+S) assumes a second maximum value on the interface 10; the second maximum value can be equal to the first maximum value but is usually different.

According to a fourth variant, the thermal treatment (RTP processing) is carried out such that the depth profile first has a rising curve over the layer thickness and, then, has a declining curve, i.e., the value of the ratio S/(Se+S) has a first minimum value on the surface 9, initially increases from the surface 9 toward the interface 10, and assumes a (single) maximum value between the surface and the interface 9, 10, and, then, decreases again such that the value of the ratio S/(Se+S) assumes a second minimum value on the interface 10; the second minimum value can be equal to the first minimum value but is usually different.

In the method according to the invention, etching, for example, with KCN, is optionally provided in order to remove copper selenide and/or copper sulfide, particularly with copper-rich processing (Cu/(Zn+Sn)>1).

In the following, referring to FIG. 2 through FIG. 4, different procedures for producing an absorber 2 consisting of the pentanary compound semiconductor CZTSSe or of pentanary kesterite/stannite of the type $Cu_2ZnSn(S,Se)_4$ in the layer structure 1 of FIG. 1 are indicated.

Exemplary Embodiment 1

Figure 2:
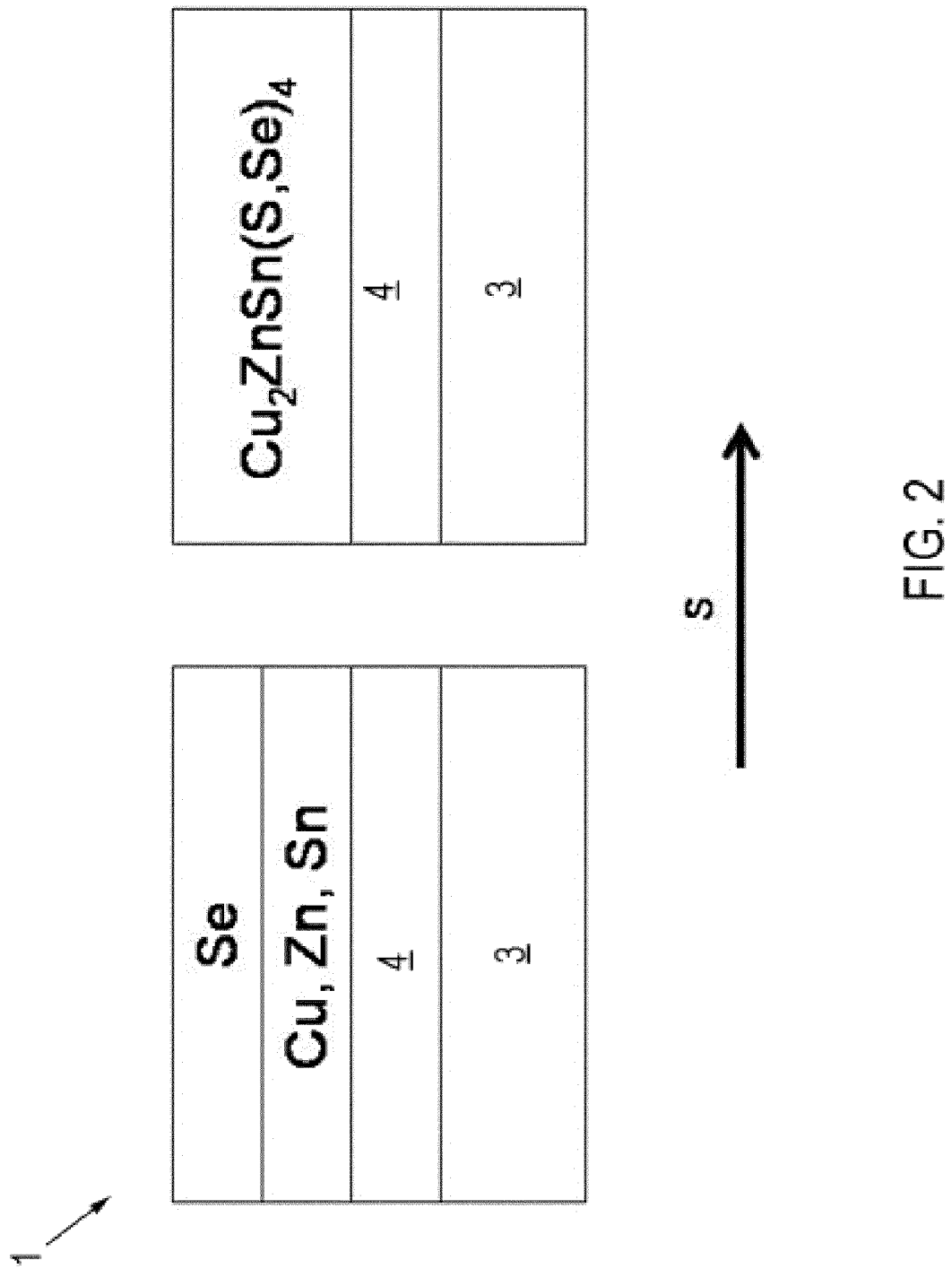
FIG. 2-4 sectional views to illustrate specific procedures for producing the pentanary compound semiconductor CZTSSe.

FIG. 2 illustrates a first procedure for producing the absorber 2 consisting of the pentanary compound semiconductor CZTSSe.

First, the first precursor layer 5 is deposited on the back electrode layer 4, for example, by sputtering of the elements Cu, Zn, Sn from three element targets consisting of Cu, Zn, and Sn, with, optionally, an additional dopant deposition. The individual layers of the metals Cu, Zn, Sn are, for example, deposited in the layer sequence Cu/Zn/Sn, but with other layer sequences also possible. Preferably, a specific layer sequence, for example, Cu/Zn/Sn, is deposited several times (preferably 2 to 20 times) consecutively, wherein the layer sequences can be identical to each other or different. Then, the second precursor layer 6 made of the chalcogen selenium is deposited onto the first precursor layer 5, which can be done, for example, by thermal evaporation (PVD [physical vapor deposition]). The layer construction 7 accordingly comprises the precursor elements or precursor phases Cu—Zn—Sn/Se, referred to in the following as "Cu—Zn—Sn/Se precursor".

Then, the Cu—Zn—Sn/Se precursor is subjected to rapid thermal processing (RTP) in a sulfur-containing atmosphere. For this, S-gas and/or $H_2S$-gas is fed into the process chamber 13 containing the layer structure 1. The temperature during the thermal treatment is, preferably, higher than 400° C., particularly preferably higher than 500° C. By means of the thermal treatment, a reactive conversion of the Cu—Zn—Sn/Se precursor into the pentanary compound semiconductor $Cu_2ZnSn(S,Se)_4$, which forms the absorber 2, is effected.

The processing of the selenium-containing Cu—Zn—Sn/Se precursor in a sulfur-containing atmosphere enables an exchange process of selenium and sulfur between the second precursor layer 6 and the process atmosphere. By this means, the sulfur content and thus the band gap of the $Cu_2ZnSn(S,Se)_4$ compound semiconductor formed can be selectively influenced during the layer formation process. It is therefore possible, by means of a time-dependent and/or concentration-dependent variation of the sulfur content in the reaction gas atmosphere during thermal processing to produce, as desired, a defined concentration profile (depth profile) along the layer thickness of the $Cu_2ZnSn(S,Se)_4$ compound semiconductor formed. An improvement of the efficiency of the thin-film solar cell can be obtained by means of the band gap profile produced by the absorber 4.

For example, in a special embodiment of the method, in a first (earlier) phase, an inert process gas (e.g., nitrogen ($N_2$) or argon (Ar)) can be fed in; and in a second (later) process phase, S-gas and/or $H_2S$-gas (or another S-containing gas) can be fed in as process gas. For example, but not mandatorily, S-gas and/or $H_2S$-gas could be fed in only in a second half of the time interval of the thermal treatment, wherein the time interval of the feed can last all the way to the end of the thermal treatment or can end earlier. By means of the feeding of $H_2S$-gas and/or S-gas, a sulfur profile is created through incorporation of S and subsequent diffusion processes such that the ratio S/(Se+S) is at a maximum on the surface 9 and decreases toward the interface 10. The thus increased band gap on the surface 9 (maximum ratio S/(Se+S)) leads in the thin-film solar cell to an increase in the open circuit voltage. On the other hand, the level of the short-circuit current is determined by the minimum of the band gap in the interior of the absorber 2. In combination, the defined sulfur profile leads advantageously to an increase in the efficiency of the thin-film solar cell or thin-film solar module.

Alternatively or additionally, it would be possible for S-gas and/or $H_2S$-gas to be fed in during an (earlier) first phase, (for example, but not mandatorily, during the first half of the time interval) of the thermal treatment and, optionally, in a second (later) process phase, for an inert gas to be fed in, in order to selectively influence the sulfur depth profile. For example, two time intervals in which S-gas and/or $H_2S$-gas is fed in could be interrupted by a time interval in which only inert gas is fed in. However, it would also be conceivable for S-gas and/or $H_2S$-gas to be fed in during the complete thermal treatment.

Exemplary Embodiment 2

Figure 3:
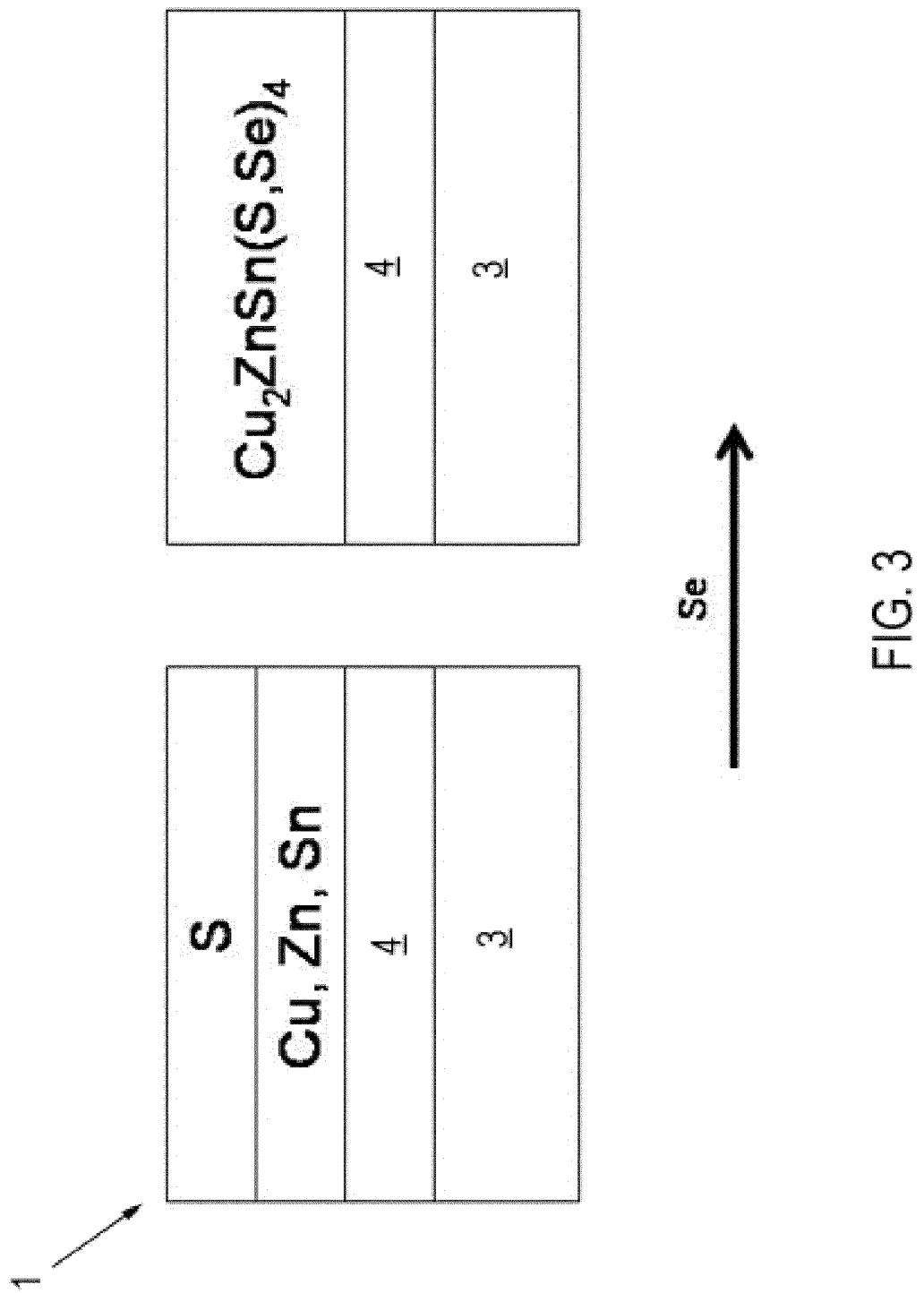

FIG. 3 illustrates another method for producing the absorber 2 consisting of the pentanary compound semiconductor CZTSSe. In order to avoid unnecessary repetition, only the differences relative to Exemplary Embodiment 1 are explained; and, otherwise, reference is made to the statements made there.

Accordingly, instead of a deposition of Se for producing the second precursor layer 6, a deposition of the chalcogen S is provided such that the layer construction 7 includes the precursor elements Cu—Zn—Sn/S (Cu—Zn—Sn/S precursor). The Cu—Zn—Sn/S precursor is subjected to rapid thermal processing in a Se-containing atmosphere. For this, Se-gas and/or $H_2Se$-gas is fed into the process chamber 13 containing the layer structure 1. By means of the thermal treatment, a reactive conversion of the Cu—Zn—Sn/S precursor into the pentanary compound semiconductor $Cu_2ZnSn(S,Se)_4$, which forms the absorber 2, is effected.

The processing of the S-containing Cu—Zn—Sn/S precursors in a Se-containing atmosphere enables an exchange process of S and Se between the second precursor layer 6 and the gas phase. By this means, the sulfur content of the $Cu_2ZnSn(S,Se)_4$ compound semiconductor formed can be selectively influenced during the layer formation process.

For example, in a special embodiment of the method, in a (later) second phase, Se-gas and/or $H_2Se$-gas (or another Se-containing gas) can be fed in as a process gas; and in an (earlier) first process phase, an inert gas (e.g., nitrogen ($N_2$) or argon (Ar)) can be fed in. For example, but not mandatorily, Se-gas and/or $H_2Se$-gas could be fed in only in a second half of the time interval of the thermal treatment. By means of the feeding of H$_2$Se-gas and/or Se-gas, a sulfur profile is created through incorporation of Se and subsequent diffusion processes such that the ratio S/(Se+S) is at a minimum on the surface 9 and increases toward the interface 10.

Alternatively or additionally, it would be possible for Se-gas and/or H$_2$Se-gas to be fed in during an (earlier) first phase (for example, but not mandatorily, during the first half of the time interval) of the thermal treatment and, optionally, in a second process phase, for an inert gas to be fed in, in order to selectively influence the sulfur depth profile. For example, two time intervals in which Se-gas and/or H$_2$Se-gas is fed in could be interrupted by a time interval in which only inert gas is fed in. However, it would also be conceivable for Se-gas and/or H$_2$Se-gas to be fed in during the complete thermal treatment.

Exemplary Embodiment 3

Figure 4:
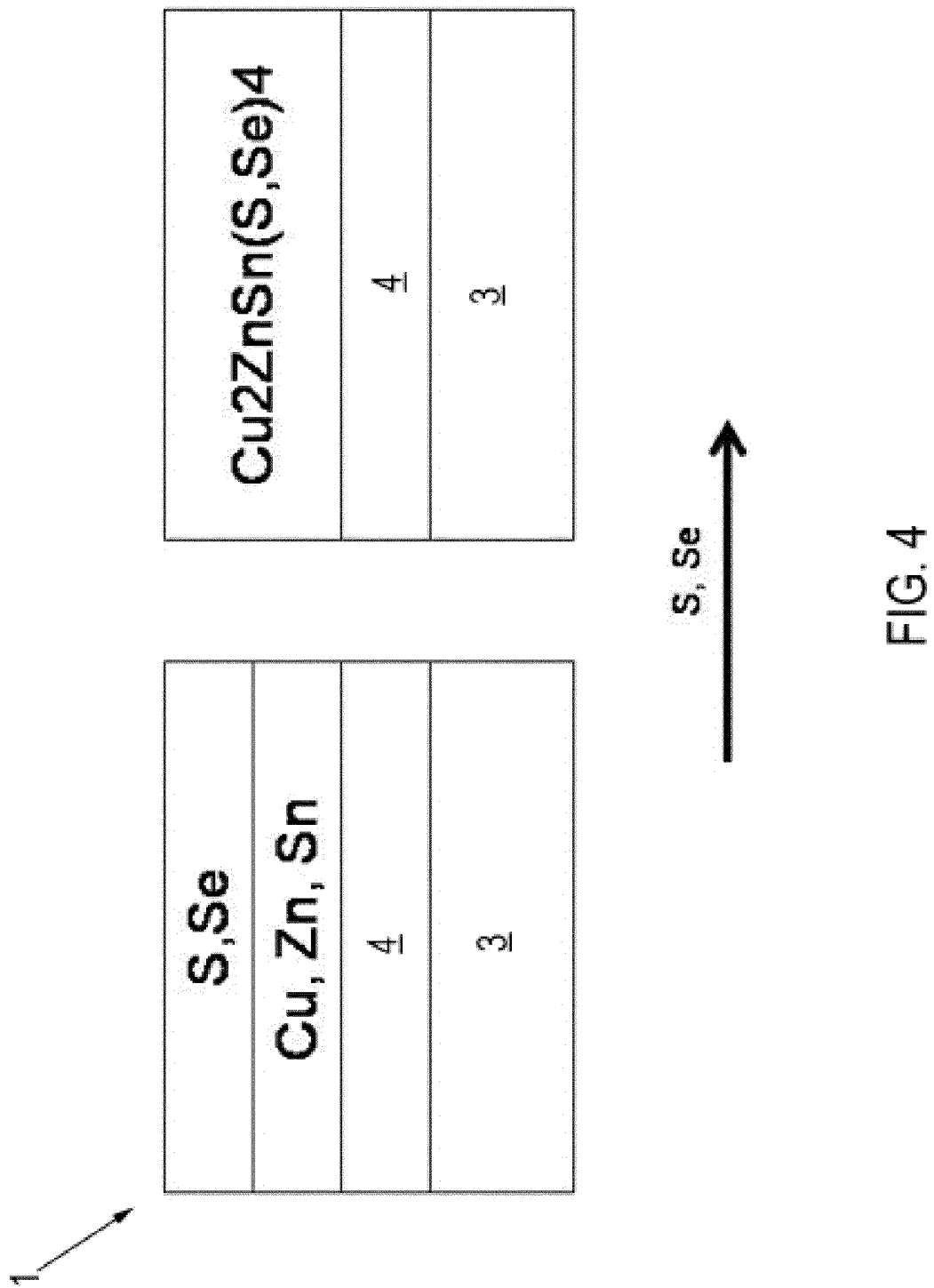

FIG. 4 illustrates another method for producing the absorber 2 consisting of the pentanary compound semiconductor CZTSSe. In order to avoid unnecessary repetition, only the differences relative to Exemplary Embodiment 1 are explained; and, otherwise, reference is made to the statements made there.

Accordingly, instead of a deposition of Se for producing the second precursor layer 6, a deposition of the two chalcogens S and Se is provided such that the layer construction 7 includes the precursor elements Cu—Zn—Sn/S—Se (Cu—Zn—Sn/S—Se precursor). The second precursor layer 6 can include at least two individual layers made of S and Se or Se and S. In addition, it can be advantageous for the second precursor layer 6 to include a plurality n (n>2) of the layer sequences, each consisting of two individual layers S and Se or Se and S, (n×S/Se or n×Se/S).

The Cu—Zn—Sn/S—Se precursor is subjected to rapid thermal processing in a S-containing and/or Se-containing atmosphere. For this, Se-gas and/or H$_2$Se-gas (or another selenium-containing gas) and/or S-gas and/or H$_2$S-gas (or another sulfur-containing gas) is fed into the process chamber 13 containing the layer structure 1. By means of the thermal treatment, a reactive conversion of the Cu—Zn—Sn/S—Se precursor into the pentanary compound semiconductor Cu$_2$ZnSn(S,Se)$_4$, which forms the absorber 2, is effected.

The processing of the sulfur- and selenium-containing Cu—Zn—Sn/S—Se precursor in a S- and/or Se-containing atmosphere enables an exchange process of S and Se between the second precursor layer 6 and the gas phase. By this means, the sulfur content of the Cu$_2$ZnSn(S,Se)$_4$ compound semiconductor can be selectively influenced during the layer formation process. In addition, by providing Se and S in the second precursor layer 6, the reaction kinetics in the RTP process can be influenced, with, in particular, positive effects with regard to the process time minimization being probable (e.g., due to a preferred reaction of Cu with S).

For example, in a special embodiment of the method, in an (earlier) first phase, Se-gas and/or H$_2$Se-gas (or another selenium-containing gas) and/or S-gas and/or H$_2$S-gas (or another sulfur-containing gas) can be fed in as a process gas; and in a (later) second process phase, an inert gas can be fed into the process chamber 13 containing the layer structure 1. Alternatively or additionally, it would be possible for Se-gas and/or H$_2$Se-gas and/or S-gas and/or H$_2$S-gas to be fed in during a (later) second phase and, optionally, in an earlier first phase, for an inert gas to be fed into the process chamber 13. For example, two time intervals in which Se-gas and/or H$_2$Se-gas and/or S-gas and/or H$_2$S-gas is fed in could be interrupted by a time interval in which only inert gas is fed in. However, it would also be conceivable for Se-gas and/or H$_2$Se-gas and/or S-gas and/or H$_2$S-gas to be fed in during the complete thermal treatment.

LIST OF REFERENCE CHARACTERS

1 layer structure
2 absorber
3 substrate
4 back electrode layer
5 first precursor layer
6 second precursor layer
7 layer construction
8 arrow
9 surface
10 interface
11 precursor layer stack
12 body
13 process chamber

The invention claimed is:

1. A method for producing a compound semiconductor composed of pentanary kesterite/stannite of a type Cu$_2$ZnSn(S,Se)$_4$, which comprises the following steps:
   producing at least one precursor layer stack, consisting of a first precursor layer and a second precursor layer, wherein, in a first stage, the first precursor layer is produced by deposition of metals copper, zinc, and tin onto a body, and, in a second stage, the second precursor layer is produced by deposition of chalcogens sulfur and/or selenium onto the first precursor layer,
   thermally treating the at least one precursor layer stack in a process chamber such that the metals of the first precursor layer and at least one chalcogen of the second precursor layer are reactively converted into a compound semiconductor, and
   feeding at least one process gas into the process chamber during a thermal treatment of the at least one precursor layer stack, wherein, if a chalcogen, selected from sulfur and selenium, is contained in the second precursor layer, a respective other chalcogen and/or a compound containing the respective other chalcogen is contained in the process gas, or, if the two chalcogens sulfur and selenium are contained in the second precursor layer, sulfur and/or selenium and/or a sulfur-containing compound and/or a selenium-containing compound is contained in the process gas.

2. The method according to claim 1, wherein a sulfur depth profile is implemented from a surface of the compound semiconductor to an interface with the body such that
   a sulfur content has a maximum value on the surface, decreases toward the interface, and has a minimum value on the interface; or
   the sulfur content has a minimum value on the surface, increases toward the interface, and has a maximum value on the interface; or
   the sulfur content has a first maximum value on the surface, decreases to a minimum value toward the interface, and, then, increases again, and has a second maximum value on the interface; or
   the sulfur content has a first minimum value on the surface, increases to a maximum value toward the interface, and, then, decreases again, and has a second minimum value on the interface.

3. The method according to claim 2, wherein the sulfur depth profile is implemented such that a relative variation of a sulfur content amounts to at least 10% over at least a part of the sulfur depth profile.

4. The method according to claim 1, wherein
a layer stack consisting of individual layers of the metals copper, zinc, and tin is deposited several times consecutively, and/or
a layer stack consisting of individual layers of the chalcogens sulfur and selenium is deposited several times consecutively.

5. The method according to claim 1, wherein the at least one precursor layer stack is deposited several times consecutively.

6. The method according to claim 1, wherein the at least one process gas is fed in during one or a plurality of second time intervals, with the second time interval shorter in each case than a first time interval, during which the thermal treatment is carried out.

7. The method according to claim 1, wherein the first precursor layer is implemented such that
a copper content is less than a combined content of zinc and tin, and
a zinc content is greater than a tin content.

8. The method according to claim 1, wherein the two precursor layers are implemented such that a ratio of a total content of chalcogens to a total content of metals is greater than or equal to 1.

9. A method comprising:
using the method for producing a compound semiconductor composed of pentanary kesterite/stannite of the type $Cu_2ZnSn(S,Se)_4$ according to claim 1 for producing an absorber of a thin-film solar cell or of a thin-film solar module.

10. The method according to claim 2, wherein the sulfur depth profile is implemented such that a relative variation of a sulfur content amounts to at least 20% over at least a part of the sulfur depth profile.

11. The method according to claim 1, wherein the compound semiconductor has a homogeneous sulfur content implemented from a surface of the compound semiconductor to an interface with the body.

12. The method according to claim 2, wherein the sulfur content is adjusted by sulfur and/or selenium and/or a sulfur-containing compound and/or a selenium-containing compound contained in the process gas.

* * * * *